United States Patent [19]
Calabro

[11] 3,896,481
[45] July 22, 1975

[54] HEAT DISSIPATOR FOR METAL CASE TRANSISTOR

[76] Inventor: Anthony D. Calabro, 8738 W. Chester Pike, Upper Darby, Pa. 19082

[22] Filed: July 2, 1974

[21] Appl. No.: 485,070

[52] U.S. Cl. .................... 357/81; 165/80; 174/15
[51] Int. Cl.² ............................ H01L 23/02
[58] Field of Search ............... 357/81; 165/80, 105; 174/15

[56] References Cited

UNITED STATES PATENTS

| | | | |
|---|---|---|---|
| 2,236,496 | 4/1941 | Beggs | 165/80 |
| 3,047,648 | 7/1962 | Mowatt | 357/81 |
| 3,195,628 | 7/1965 | McAdam | 357/81 |
| 3,212,569 | 10/1965 | McAdam | 357/81 |
| 3,247,896 | 4/1966 | Chu | 357/81 |
| 3,259,813 | 7/1966 | Lindstrand | 357/81 |

*Primary Examiner*—Andrew J. James
*Attorney, Agent, or Firm*—Anthony J. Casella

[57] ABSTRACT

A heat dissipator for a metal case transistor includes an elongated integral member having a lower split annular collar adapted to frictionally engage the metal case of the transistor, an upper annular collar spaced from the lower collar, and an intermediate array of U-shaped deflectors that are spaced so as to enable air currents to pass through to the center of the elongated heat dissipator for generating turbulent flow in order to increase the rate of heat convection from the transistor case upwardly through the center of the dissipator.

12 Claims, 5 Drawing Figures

HEAT DISSIPATOR FOR METAL CASE TRANSISTOR

The present invention relates to a heat dissipator for miniaturized electronic components, and more particularly, a heat dissipator which is adapted to be releasably connected to a metal case transistor in order to increase the efficiency of the transistor by the proper dissipation of the heat generated while the transistor is functioning.

With the advent of sophisticated electronics, and the requirement for miniaturization of electronic components, it has been found necessary to compact as many electronic components, such as transistors and comparable components, upon a circuit board in extremely close proximity. This alone produces a significant heating problem which can affect the efficiency of metal case transistors. In addition, it is well known that transistors do generate a sufficient amount of heat during operation to warrant the provision of means for facilitating the cooling of the transistors. As is readily apparent, considering the low profile of transistors, it is particularly desirable that means be provided for increasing the surface area of the metal case so as to provide an arrangement for conducting heat away from the metal case, and in addition providing sufficient surface area for facilitating the convection of heat from the metal case. To this end the industry has developed numerous type of static heat dissipators which have taken many forms and sizes. One commonly employed arrangement is to provide a rather large surface area member having a plurality of upstanding legs or deflectors, with the total plan area of the dissipator being much greater than the size of the transistor. Accordingly, the employment of such heat dissipators requires additional circuit board area, which is contrary to the general objective of miniaturization of the circuit. Other forms of heat dissipators are of complex construction which greatly increases the cost of the circuit, which again is undesirable, and still other forms of heat dissipators are of generally solid construction whereby the dissipator merely relies on the conducting of heat from the metal case, rather than employing the principle of air convection in order to increase the efficiency of heat dissipation.

Accordingly, it is the primary object of the subject invention to provide a new and improved heat dissipator for electrical components which is lightweight, simple in design, inexpensive, compact, and because of its specific configuration is capable of dissipating heat by conduction and convection. A considerable amount of the heat generated by a transistor is dissipated since the subject heat dissipator is able to generate turbulence in the convection currents passing over the transistor thereby resulting in rapid heat convection from the case upwardly through the center of the elongated heat dissipator.

It is a further object of the subject invention to provide a heat dissipator made of integral construction, and of copper or aluminum material, with the overall plan size of the heat dissipator being approximately equal to the overall plan size of the metal case transistor.

Still another object of this invention is to provide a new and improved dissipator for metal case transistors which, although constructed of relatively thin copper material, includes a split annular collar which can readily grasp the transistor case with a firm full-surface engagement, and which includes an intermediate array of spaced, U-shaped heat dissipating deflectors that are arranged in a manner so as to generate turbulent flow for dissipation of heat from the metal case.

The foregoing general objects and other more specific objects will become apparent from a reading of the following detailed specification and drawings in which.

Figure 1:
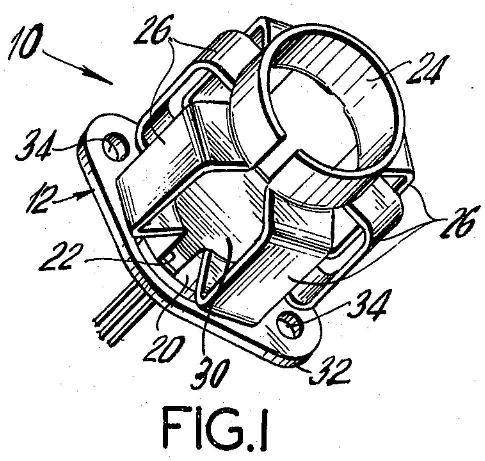
FIG. 1 is a perspective view of the subject heat dissipator releasably connected to a metal case transistor.

Referring to FIG. 1, heat dissipator 10 is made according to the teaching of the subject invention and is adapted to be releasably connected to a metal case transistor 12. The heat dissipator 10 is formed from a single sheet of relatively thin sheet metal, with the material being of a nature that can be readily slit, bent, and rolled into a generally elongated annular configuration, with the circumference thereof being generally continuous except for a single longitudinal split. The heat dissipator is preferably made of copper material, and it has been found that a 0.020 thickness copper alloy is suitable for the heat dissipator of the subject invention.

Figure 2:
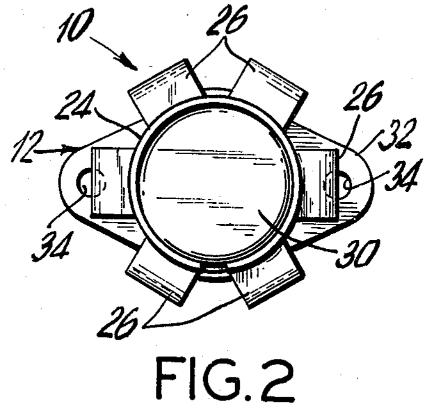
FIG. 2 is a plan view of the subject heat dissipator as releasably connected to a metal case transistor.
Figure 3:
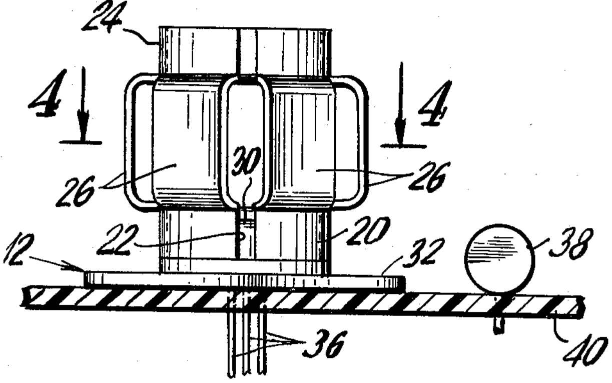
FIG. 3 is a side view of the subject heat dissipator as releasably connected to a metal case transistor.

Referring to FIGS. 1 through 4, the heat dissipator 10 is of integral construction and is generally elongated, including a first or lower annular collar 20 which is split as at 22, a second or upper split annular collar 24, and an intermediate array of spaced deflectors 26. As shown in the side view of FIG. 3, each of the deflectors 26 is generally U-shaped in configuration, and the circumferential spacing between the deflectors 26 generally corresponds to the width of each deflector, as more clearly shown in FIG. 2. The resulting configuration of the heat dissipator 10 is a generally cylindrical shaped arrangement having an enlarged diameter section in the region of the intermediate array of spaced, U-shaped deflectors 26, and terminating at an upper narrower section defined by the annular collar 24. AS previously indicated, the lower annular collar 20 is split in order to enable the heat dissipator 10 to be releasably connected by friction to the metal case portion 30 of transistor 12. As in conventional designs, the transistor 12 includes the metal cap portion 30 in which the circuit elements are housed, as well as flattened base portion 32 which includes holes 34 for mounting the transistor to a conventional circuit board 40 (see FIG. 3), with the leads 36 of the transistor element 12 extending from the opposite side of the base 32 and through the circuit board 40. As also shown in FIG. 3, because of the specific geometric configuration of the heat dissipator 10, there is no interference between dissipator 10 and other components, such as at 38, mounted on board 40. In fact, as shown in FIG. 2, the plan area covered by the heat dissipator generally corresponds to the plan area of the base 32 of the transistor 12, thereby enabling compactness and miniaturization of the resulting circuit.

Figure 4:
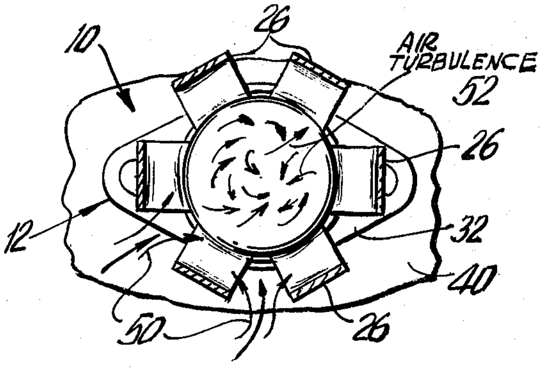
FIG. 4 is a sectional view taken along line 4—4 in FIG. 3.

Reference is made to FIG. 4 which illustrates a cross-sectional view of the dissipator 10 taken along a horizontal plane extending through the intermediate array of deflectors 26, and also illustrating the turbulent air flow generated within the elongated or chimney portion of the heat dissipator 10. More particularly, whether the circuit is exposed to forced air cooling, or merely relies on transient air flow for maintaining the circuit at a desirable temperature level for efficient operation, any air movement from any direction toward the heat dissipator 12 is diverted by the deflectors 26 into the center of the heat dissipator to create turbulence and improve heat transfer. More particularly, since each deflector is disposed at a different angle to an incoming or transient air stream, as designated by numeral 50 in FIG. 4, a turbulent flow 52 is generated within the central region of the heat dissipator 10. Another factor contributing to the generation of the turbulent flow are the sharp edges of the deflectors 26 which, due to the Coanda effect, divert the air stream to create turbulence. If desired, the deflectors 26 may be twisted along their longitudinal axes to further enhance the generation of turbulence. Furthermore, although only six deflectors 26 are illustrated, the dissipator 10 may be configured to include any desired plurality, such as 8 or 10 deflectors.

Considering the fact that the turbulent air flow 52 is heated by the heat of convection released from the metal case, said heated air flows upwardly and is effectively channeled through the second or upper annular collar 24, thereby providing a chimney or stack effect which operates in a manner to create a draft thereby further encouraging air flow through the spaced between the deflectors 26 immediately above the metal case 12, and thence upwardly through the annular collar 24.

In those applications where the circuit board is mounted generally vertically, and hence the heat dissipator 10 extends generally horizontally, the transient air stream enters the "stack" portion of the dissipator 10 through the lowermost spaces between the deflectors 26 and exits through the uppermost spaces, thereby also creating a draft flow for enhancing the heat dissipation effect of member 10.

The stack or chimney effect of the turbulant air passing over the metal case causes, by heat convection, a lowering of the temperature of the transistor case 12. The U-shaped configuration of deflectors 26 enhances this effect since it increases the size of the region wherein the turbulent flow 52 is generated, thereby increasing the amount of turbulent flow and the transfer of heat from the transistor 12. This heat dissipation is in addition to the heat absorbed by the heat dissipator 10 by means of heat conduction. Heat conduction through the dissipator 10 plays an important part in the transfer of heat away from the transistor case 12.

Radiation and convection is also stressed in passing heat from the dissipator to surrounding environment, and when a transistor is provided with a heat dissipator of the type herein described, the transistor presents an exceedingly small package, not very much greater than the transistor itself. Hence the single advantage inherent in the small volume occupied by the transistor is proportion to its performance results in virtually full advantage of utilizing the heat dissipator 10 of the subject invention. This is further enhanced by the fact that the heat dissipator 10 only engages the metal case 30 of the transistor, rather than covering the larger area of the base 32. Because the subject heat dissipator is made of a single sheet of metal stock, it is relatively cheap to manufacture. Although the heat dissipator 10 is preferably made of copper, it may be also made of other heat conducting metals, such as aluminum.

Figure 5:
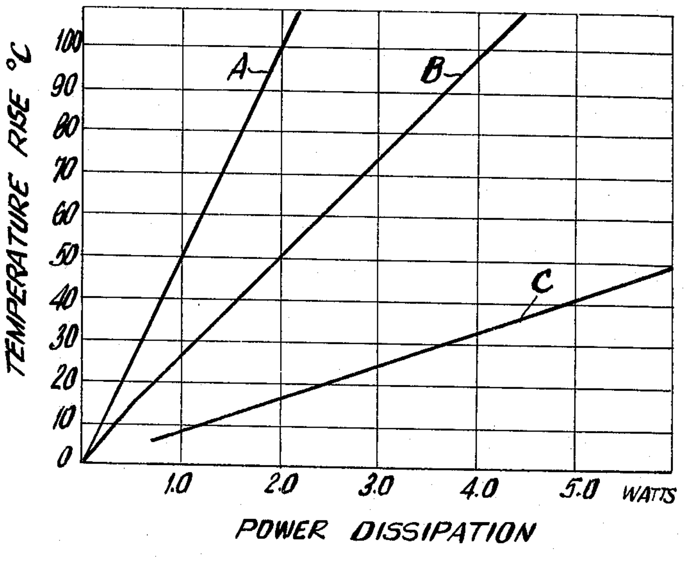
FIG. 5 is a graph showing the effectiveness of the subject heat dissipator as applied to a metal case transistor.

FIG. 5 dramatically illustrates the effectiveness of the heat dissipator 10 made according to the subject invention, in an actual test conducted by the applicant. In the graph of FIG. 5, the temperature rise in degrees centigrade above the ambient temperature is plotted against the power dissipated (in units of watts) of the transistor. A standard transistor, designated TO-66, was employed in the test procedure, and tests were run with the transistor operating without the heat dissipator 10 under conditions of natural or ambient convection; with the heat dissipator 10 under similar ambient or natural convection conditions; and with the heat dissipator 10 and under conditions where forced air cooling was provided by means of a fan. The results are plotted in the form of three curves, with curve A being the test wherein the transistor was powered without the aid of the heat dissipator 10 of the subject invention. As indicated in the graph, at a 2.0 watt condition, the temperature rise of the transistor case (as measured directly under the junction of the transistor) was 100° centigrade above the ambient temperature. As is readily apparent, this is undesirable since transistors have the basic characteristic that they cannot support heating above a certain optimum temperature, and thereafter expected to regain their ability to perform. In this respect transistors are unlike electronic tubes which, even when overheated only temporarily lose their effectiveness which is regained upon cooling to below the optimum temperature. Heating of transistors above the optimum temperature not only impairs their effectiveness, but in fact, actually destroys the bond between the materials of the transistor which is not regained upon cooling and hence the transistors may be rendered useless.

The curve designated B in the graph of FIG. 5 illustrates the results of the test run on the same transistor when provided with the heat dissipator 10 of subject invention, in conditions of natural or ambient convection. As shown in FIG. 5, the effectiveness of the heat dissipator 10, as contrasted to the condition when the transistor is not provided with the heat dissipator 10 (see curve A), is a 100 percent improvement in that the temperature rise of the transistor case above ambient does not reach a 100° until 4 watts of power dissipation is present in the transistor.

Curve C of the graph of FIG. 5 is a plot of the test results wherein the transistor is provided with the subject heat dissipator 10 and forced air cooling is provided. At 5 watts power dissipation, the temperature rise of the transistor case is only about 42° centigrade.

Accordingly, there is provided a new improved heat dissipator for electrical components, which has the characteristics of being lightweight, simple in design, inexpensive, compact, and because of its specific configuration is capable of dissipating heat by conduction and convection. As noted above, the heat dissipator is preferably made of integral construction, and of copper of aluminum material, with the overall plan size of the heat dissipator being approximately equal to the overall plan size of the associated metal case transistor.

What is claimed is:

1. A heat dissipator for metal case transistors comprising:

a first annular collar which is split and is made of a metal material for engaging the case of the transistor;

a second split annular collar also made of a metallic material and spaced from said first collar; and an intermediate array of spaced, U-shaped deflectors disposed between said first and second collars, said deflectors being made of a metallic material and operative to deflect air currents towards the region immediately above the case so as to increase the rate of heat convection from the case upwardly through the second annular collar.

2. A heat dissipator as in claim 1 wherein the diameters of the first and second collars are equal.

3. A heat dissipator as in claim 1 wherein the heat dissipator is made of integral construction from a single sheet of metallic material.

4. A heat dissipator as in claim 3 wherein the metallic material is copper.

5. A heat dissipator as in claim 1 wherein the array of U-shaped deflectors are twisted with respect to the cylindrical plane extending between the first and second collars.

6. A heat dissipator as in claim 1 wherein the spacing between the deflectors is approximately equal to the width of each deflector.

7. A heat dissipator for metal case transistors comprising an elongated, integral construction including a lower annular collar, an upper annular collar, and an intermediate array of U-shaped deflectors, which deflectors are spaced so as to enable air currents to pass through the center of the elongated heat dissipator for generating turbulent flow in order to increase the rate of heat convection from the transistor case upwardly through the center of the heat dissipator.

8. A heat dissipator as in claim 7 which is made of copper.

9. A heat dissipator as in claim 7 wherein the upper and lower annular collars are split.

10. A heat dissipator as in claim 7 wherein the spacing between the deflectors is approximately equal to the width of each deflector.

11. A heat dissipator as in claim 7 wherein the integral construction is made of copper metal.

12. A heat dissipator as in claim 7 wherein the integral construction is made of aluminum.

* * * * *